(12) United States Patent
Bothra et al.

(10) Patent No.: US 6,191,481 B1
(45) Date of Patent: Feb. 20, 2001

(54) ELECTROMIGRATION IMPEDING COMPOSITE METALLIZATION LINES AND METHODS FOR MAKING THE SAME

(75) Inventors: Subhas Bothra, San Jose; Stephen L. Skala, Fremont; Dipu Pramanik, Saratoga, all of CA (US)

(73) Assignee: Philips Electronics North America Corp., New York, NY (US)

( * ) Notice: Under 35 U.S.C. 154(b), the term of this patent shall be extended for 0 days.

(21) Appl. No.: 09/215,099

(22) Filed: Dec. 18, 1998

(51) Int. Cl.$^7$ .................................................. H01L 23/48
(52) U.S. Cl. ........................ 257/734; 257/758; 257/767; 257/773
(58) Field of Search ................... 257/734, 758, 257/767, 773, 775; 438/622, 666, 927

(56) References Cited

U.S. PATENT DOCUMENTS

| | | | |
|---|---|---|---|
| 5,036,383 | 7/1991 | Mori | 357/71 |
| 5,248,903 | 9/1993 | Heim | 257/748 |
| 5,382,831 | * 1/1995 | Atakov et al. | 257/767 |
| 5,502,337 | 3/1996 | Nozaki | 257/773 |
| 5,621,246 | 4/1997 | Motoyama | 257/736 |
| 5,689,139 | * 11/1997 | Bui et al. | 257/758 |
| 5,712,510 | * 1/1998 | Bui et al. | 257/758 |
| 5,736,791 | 4/1998 | Fujiki et al. | 257/781 |
| 5,739,587 | 4/1998 | Sato | 257/758 |
| 5,923,088 | 7/1999 | Shiue et al. | 257/758 |

OTHER PUBLICATIONS

S. Skala and S. Bothra, "Effects of W–Plug Via Arrangement on Electromigration Lifetime of Wide Line Interconnects", IEEE, ITC Tech. Conf., Jun. 1998, San Francisco, CA, pp. 116–118.

A. Blech, "Electromigration in thin aluminum films on titanium nitride", Journal of Applied Physics, vol. 47, No. 4, Apr. 1976, pp. 1203–1208.

H. –U. Schreiber, "Electromigration Threshold in Aluminum Films", Solid State Electronics, vol. 28, No. 6, 1985, pp. 617–626.

Hu et al, "Electromigration and stress–induced voiding in fine Al and Al–alloy thin–film lines", IBM J. Res. Develop., vol. 39, No. 4, Jul. 1995, pp. 465–497.

* cited by examiner

*Primary Examiner*—T. N. Quach
(74) *Attorney, Agent, or Firm*—Martine Penilla & Kim, LLP

(57) ABSTRACT

Disclosed is a semiconductor integrated circuit device having a plurality of metallization levels of patterned metallization lines that are resistant to electromigration voiding, and methods for making the electromigration void resistant metallization lines. The semiconductor integrated circuit device includes a metallization line having a first end and a second end. Oxide feature regions are defined in the metallization line, and the oxide feature regions are arranged along the metallization line between the first end and the second end. Each one of the oxide feature regions are configured to be separated from a previous oxide feature region by about a Blech length or less, and each of the oxide feature regions are configured to define a region of increased metallization atom concentration and a corresponding increased back-flow force. The oxide feature regions therefore define a composite metallization interconnect line, which is well configured to retard electromigration voiding.

15 Claims, 10 Drawing Sheets

ELECTROMIGRATION IMPEDING COMPOSITE METALLIZATION LINES AND METHODS FOR MAKING THE SAME

CROSS REFERENCE TO RELATED APPLICATIONS

This application is related to the following U.S. patent application entitled "Composite Metallization Structures For Improved Post Bonding Reliability and Methods for Making the Same," having U.S. application Ser. No. 09/215,902, U.S. Pat. No. 6,020,647, filed on the same day as the instant application. This application is hereby incorporated by reference.

BACKGROUND OF THE INVENTION

1. Field of the Invention

The present relates to the manufacture of semiconductor devices. More particularly, the present invention relates to techniques for improving the reliability of semiconductor device interconnect metallization lines.

2. Description of the Related Art

Interconnect structures of integrated circuits (ICs) generally take the form of patterned metallization lines that are used to electrically interconnect devices and to provide interconnection with external circuitry. By way of example, IC devices may include metal oxide semiconductor ("MOS") devices having diffused source and drain regions separated by channel regions, and gates located over the channel regions. In practice, an IC chip may include thousands or millions of devices, such as MOS transistors.

Conventionally, a dielectric layer (e.g., silicon oxide) is deposited over the devices, and via holes are patterned and formed through the dielectric layer to the devices below. As is well known in the art, photolithography "patterning" is typically accomplished by spin-coating a photoresist layer over the dielectric layer, selectively exposing the photoresist to light through a patterned reticle having via hole patterns, developing the photoresist to form a resist via mask, and etching the exposed dielectric layer to form via holes leading to a lower level. Once the via holes are formed, a conductive material such as tungsten may be used to fill the via holes to define what are known as "W" tungsten plugs. Once the tungsten plugs are formed, a metallization layer is formed over the dielectric layer and the tungsten plugs. The metallization layer is then patterned using conventional photolithography techniques to define a first level of interconnect metal routing. This process may then be repeated if additional layers of metallization lines are desired.

In the design of any integrated circuit device, strong consideration is generally placed on examining the degree of expected electromigration that may occur in view of a metallization line's current carrying requirements. This is typically required because designers know that if too much electromigration occurs in a given metallization line having a particular width, serious reliability impacting voids may form. Accordingly, designers are commonly required to increase a metallization line's width when high levels of current are anticipated, such as, for example, in power and ground bus lines.

In certain circumstances, the designer is forced to make particular metallization lines exceedingly wide, just to prevent the possibility of excessive voiding from occurring. Widening metallization lines does, however, impose a cost penalty since this will require semiconductor chips to be larger than may be necessary to carry out the integrated circuit's designed function.

Electromigration is commonly understood to be the result of an average current flow through a conductor. The flowing electrons transfer a fraction of their momentum to the metal atoms from the scattering process. This momentum transfer in turn causes a movement of the metal atoms (i.e., mass transfer) in the direction of electron flow. Therefore, the amount of momentum transfer, and resulting metal flow, increases with increasing current density. This flow of material is seldom uniform and regions of tensile stress develop where there is a net loss of material over time and regions of compressive stress develop where there is a new increase of material over time. The development of regions of tensile and compressive stress therefore create stress gradients. These stress gradients also cause a flow of metal since stress drives a flow from regions of high stress (i.e., compressive stress) to regions of low stress (i.e., tensile stress).

To pictorially illustrate electromigration problem, FIG. 1 shows a cross-section of a semiconductor substrate 10 having a plurality of conventionally fabricated layers. The semiconductor substrate 10 may include diffusion regions 12 and a polysilicon gate 14 formed over a gate oxide that is defined over the semiconductor substrate 10. A first dielectric layer 19 is formed over the semiconductor substrate 10 and is then planarized. Once planarized, via holes are formed through the first dielectric layer 19, and a conductive via 16 is defined. Next, a metallization layer is deposited and patterned over the first dielectric layer to define a first level of interconnect lines 24. The process is again repeated to form a second dielectric layer 22, conductive vias 18a and 18b, and a second level of interconnect lines 26.

Once the structure is complete, a current "I" having a given current density may be passed through the interconnect structure formed by the first and second levels of interconnect lines 24 and 26, and the conductive vias. Therefore, when current flows that are typical in interconnect lines, such as power lines "Vdd" and ground lines "Vss," are passed through this interconnect structure, the electron flow "e" may unfortunately cause electromigration voids 30 in the interconnect lines 24 and 26. For more information on electromigration and the degrading effects of electromigration, reference may be made to a article entitled "Effects of W-Plug Via Arrangement on Electromigration Lifetime of Wide Line Interconnects," by S. Skala and S. Bothra, Proceedings of the International Interconnect Technology Conference, San Francisco, Calif., June (1998). This article is hereby incorporated by reference.

As shown, the electromigration voids 30 are most commonly formed at the beginning of an interconnect line. This is believed to occur because electromigration degradation is more likely to stop when the sum of electromigration and stress is zero, which will more likely occur at the end of a line. Early observations of electromigration flow and its tendency to stop when a line is relatively short (e.g., a short distance to its terminating end) and continue when a line is relatively long (e.g., a long distance to its terminating end), was first reported by I. A. Blech. The behavior of electromigration defined in terms of the length of a metallization line has thus become widely referred to as the "Blech effect." That is, when a metallization line is at least as short as a given Blech length (also referred to as "critical length") for a particular width, electromigration voids 30 will no longer form. For more information on Blech effect and Blech length, reference may be made to an article entitled "Electromigration and Stress-Induced Voiding in Fine Al and Al-alloy Thin-Film Lines," by C. K. Hu, K. P. Rodbell, T. D. Sullivan, K. Y. Lee and D. P. Bouldin, IBM Journal of Research and Development, Vol. 39, No. 4, July 1995, pp. 465–497. This article is hereby incorporated by reference.

Although this has been widely known, this concept is generally not applicable for many of the interconnect metallization lines and power buses because such lines are generally required to be longer than the Blech length in order to meet functional specifications. As a result, designers have continued to design certain metallization lines wider than necessary in order to prevent void 30 formation which may introduce open circuits or complete functional failures.

In view of the foregoing, there is a need for integrated circuit metallization line structures that are more resistant to electromigration forming voids, without necessitating the design of exceedingly wider metallization lines.

SUMMARY OF THE INVENTION

Broadly speaking, the present invention fills these needs by providing electromigration resistant metallization lines of semiconductor integrated circuit devices and methods for designing the electromigration resistant metallization lines. It should be appreciated that the present invention can be implemented in numerous ways, including as a process, an apparatus, a system, a device, or a method. Several inventive embodiments of the present invention are described below.

In one embodiment, a semiconductor integrated circuit device having a plurality of metallization levels of patterned metallization lines, some of which have composite metallization is disclosed. The semiconductor integrated circuit device includes a metallization line having a first end and a second end. Further included are oxide feature regions defined in the metallization line. The oxide feature regions are defined along the metallization line between the first end and the second end, and each of the oxide feature regions are configured to define a region of increased metallization atom concentration and a corresponding increased back-flow force. The oxide feature regions therefore define a composite metallization which is configured to substantially prevent electromigration voiding.

In another embodiment, a semiconductor integrated circuit device having a plurality of metallization levels of patterned metallization lines is disclosed. The semiconductor integrated circuit device includes a metallization line having a first end and a second end. Oxide feature regions are further defined in the metallization line, and the oxide feature regions are defined along the metallization line between the first end and the second end. Each one of the oxide feature regions are configured to be separated from a previous oxide feature region by about a Blech length, and each of the oxide feature regions are configured to define a region of increased metallization atom concentration and a corresponding increased back-flow force. The oxide feature regions therefore define a composite metallization interconnect line, which is well configured to retard electromigration voiding.

In yet another embodiment, a method for making an integrated circuit device having a plurality of metallization levels, where each level has a plurality of metallization lines is disclosed. The method includes: (a) identifying particular ones of the plurality of metallization lines that are longer than a Blech length; (b) selecting metallization lines from the particular ones that are longer than the Blech length; (c) identifying regions along the metallization lines, such that the regions are spaced apart from each other by about the Blech length; and (d) forming oxide features into the metallization lines at the regions that are spaced apart from each other by about the Blech length. The oxide features therefore form composite metallization which is configured to produce stress gradients at intervals that are equal to or less than the Blech length. The stress gradients therefore assist in retarding electromigration in metallization lines to avoid reliability impacting voids.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for the design of electromigration resistant metallization lines of semiconductor integrated circuit devices is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
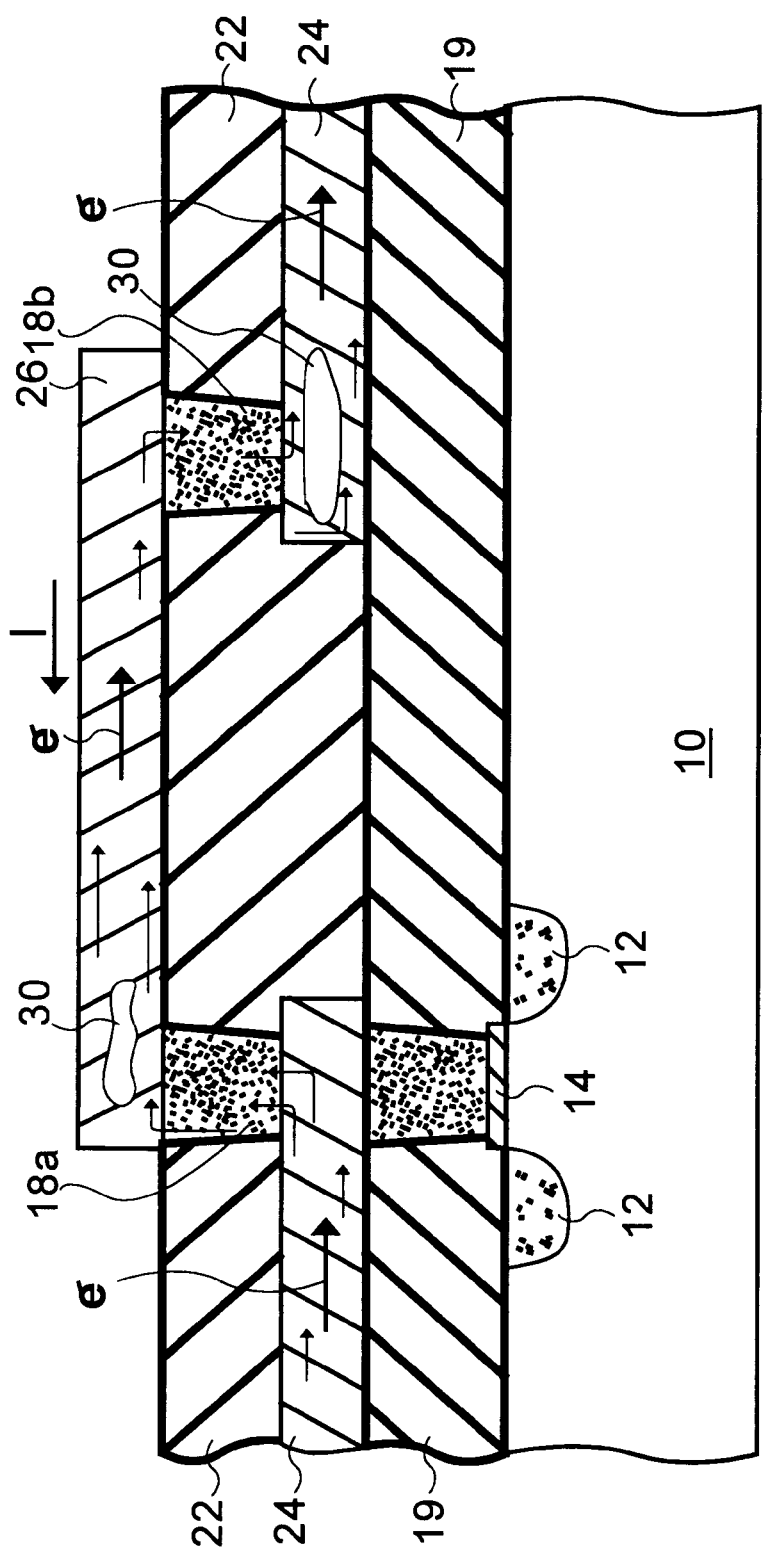
FIG. 1 shows a cross-section of a semiconductor substrate having a plurality of conventionally fabricated layers, and illustrating reliability hampering voids.
Figure 2A:
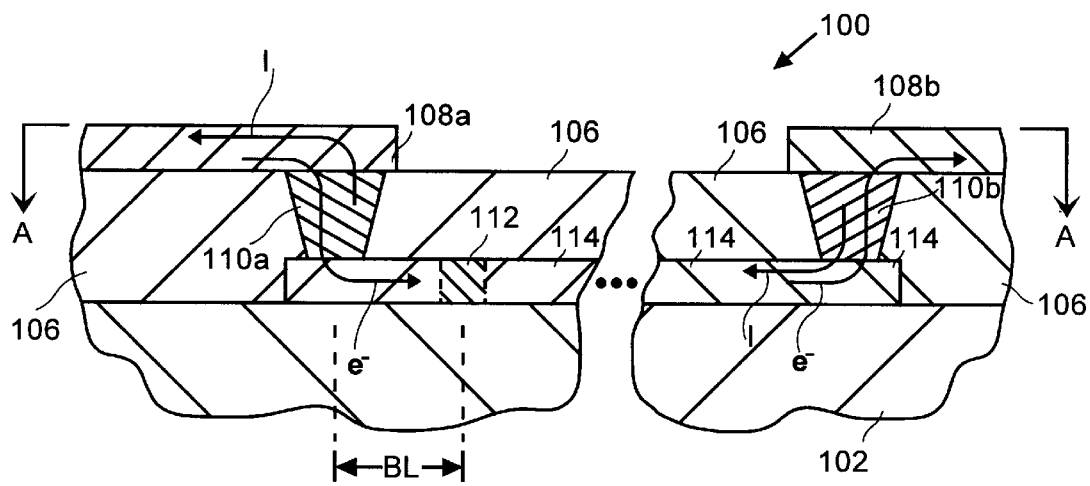
FIG. 2A illustrates a partial cross-sectional view A—A of a semiconductor device in accordance with one embodiment of the present invention.

FIG. 2A illustrates a partial cross-sectional view A—A of a semiconductor device 100 in accordance with one embodiment of the present invention. As shown, an inter-metal oxide (IMO) layer 102 is supporting a metallization line 114. Metallization line 114 is insulated from upper metallization lines 108a and 108b by another inter-metal oxide (IMO) layer 106, and conductive vias 110a and 110b assist in interconnecting metallization line 114 to ends of metallization lines 108a and 108b. As discussed above, electromigration degrading voids are a serious problem that occur when electron flows cause metal atoms to migrate from regions of tensile stress to regions of compressive stress.

In order to induce a region of compressive stress near the starting end of a somewhat long metallization line 114, an oxide feature 112 is strategically placed in such a manner that it is not separated from the beginning of the conductive via 110a by more than the Blech length (BL) for the particular width of the line and operating current carrying requirements (i.e., at specific current densities). For example, the BL may be approximately 50 microns at design rule operating currents and approximately 20microns at accelerated current densities used for accelerated electromigration testing. For instance, if the metallization line 114 is a power bus (e.g., Vdd/Vss) having a width ranging between about 5 microns to 100 microns, and most preferably about 35 microns, the BL may be about 50 microns for a current density of about $6 \times 10^5$ amps/cm$^2$ (e.g., a current of 100 milli-amps). For additional information on Blech length, reference may be made to "Electromigration in Thin Aluminum Films on Titanium Nitride," by I. A. Blech, Journal of Applied Physics, Vol. 47, No. 4, April 1976, pp. 1203–1208, and "Electromigration Threshold in Aluminum Films," by H. U. Schreiber, Solid-State Electronics, Vol. 28, No. 6, pp. 617–626 (1985). Both of these references are hereby incorporated by reference.

In this example, the thickness of the metallization line 114 may range between about 4,000 angstroms and about 10,000 angstroms, and most preferably about 5,000 angstroms. Accordingly, depending on the width, thickness, quality of metal of the metallization line and the operating current density, the BL for those parameters may be readily determined. The Blech length is closely related to the threshold current density, and for ease of understanding, particular Blech lengths (or threshold lengths) may be determined using equation (1) identified below and discussed in a paper entitled "Electromigration Threshold in Aluminum Films," by H. U. Schreiber, Solid-State Electronics, Vol. 28, No. 6, pp. 617–626 (1985). This paper was previously incorporated herein by reference.

$$L_{th}J=A \qquad (1)$$

where $L_{th}$ is the Blech (or threshold) length;

J is the current density; and

A is a constant for a given interconnect line.

Thus, $L_{th}=A/J$, and $L_{th}$ is inversely proportional to J, which is the current density. The threshold value for $(J\ L)_{th}$ product is shown on page 620 of the Electromigration Threshold in Aluminum Films reference. Reference is now made to the data of FIG. 3 of the Electromigration Threshold in Aluminum Films reference, and the temperature dependence data of FIG. 4 of the same Electromigration Threshold in Aluminum Films reference. In view of this exemplary data, a $(J\ L)_{th}$ product of 600 A/cm, for instance, means that for a current density of $1 \times 10^5$ A/cm$^2$ the Blech length will be about 60 microns. In view of this example, the Blech length can be determined for any other metallization film.

Figure 2B:
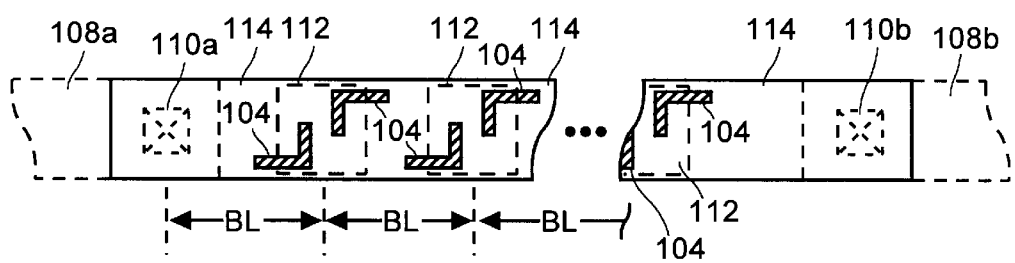
FIG. 2B illustrates an example in which oxide features are arranged at an interval set by a Blech length (BL) of the given line's geometries and current carrying requirements, in accordance with one embodiment of the present invention.

In other embodiments, the oxide features 112 may be repeated along the metallization line 114 in intervals separated by BL as shown in FIG. 2B. By doing this, intervals of compressive stress regions and tensile stress regions can be created along the metallization line 114. Preferably, the separation pitch is chosen to be approximately the BL or slightly less than the BL so that the stress gradient formed by these regions of compressive and tensile stress counteracts the electromigration flow, thus resulting in a reduced degree of electromigration damage and thus electromigration failures.

Figure 2C:
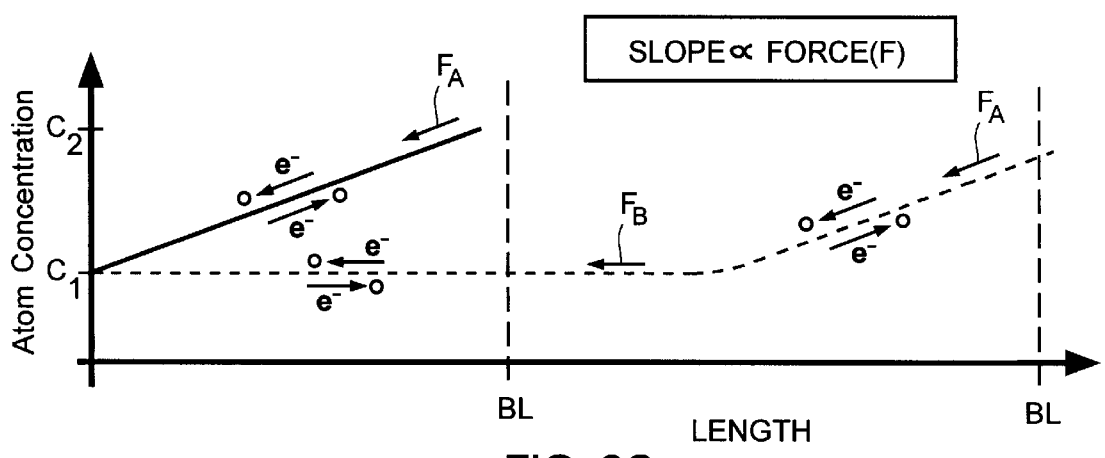
FIG. 2C illustrates a graphical plot of atom concentration over particular lengths of a metallization line and associated back-flow forces, in accordance with one embodiment of the present invention.

To better understand the benefits of adding the oxide features 112 at intervals of BL, reference is made to FIG. 2C which illustrates a plot of metal atom concentration vs. length, in accordance with one embodiment of the present invention. When the length of a metallization line 114 is as short as BL or less, the electron flow will cause an accumulation of metal atoms against the end of the metallization line. The accumulation of metal atoms will therefore cause an increased atom concentration, which then causes a back-flow of atoms in response to an atom back-flow force $F_A$. The back-flow of atoms will therefore stop the continued electromigration of atoms toward the end of the short metallization line 114.

For comparison purposes, when the metallization line 114 is longer than the Blech length BL (ie., >BL), the electrons will be allowed to carry atoms along the long metallization line 114 until possible electromigration voids are created. This is because for most of the length of the long metallization line 114, the force $F_B$ will be quite minimal until the end of the metallization line is reached. At the end of the long metallization line 114, the atom concentration will grow as illustrated by the dashed line, which causes the back-flow force $F_A$. In the graph therefore, the slope is proportional to the force of the back-flow (i.e., slope F).

Because the increased back-flow force $F_A$ occurs when metallization lines 114 are at least as short as the BL, by inserting the oxide features 112 at intervals of BL along the line, the electromigration over the line's distance will behave as though the long line was only as short as BL. Although electromigration degradation occurs most often at the beginning of a long line, the present invention, in one embodiment, places the oxide features 112 at BL intervals throughout the entire length as shown in FIG. 2B. Alternatively, the oxide feature 112 may only be placed at the beginning of the line at the BL length as shown in FIG. 2A.

Figure 3:
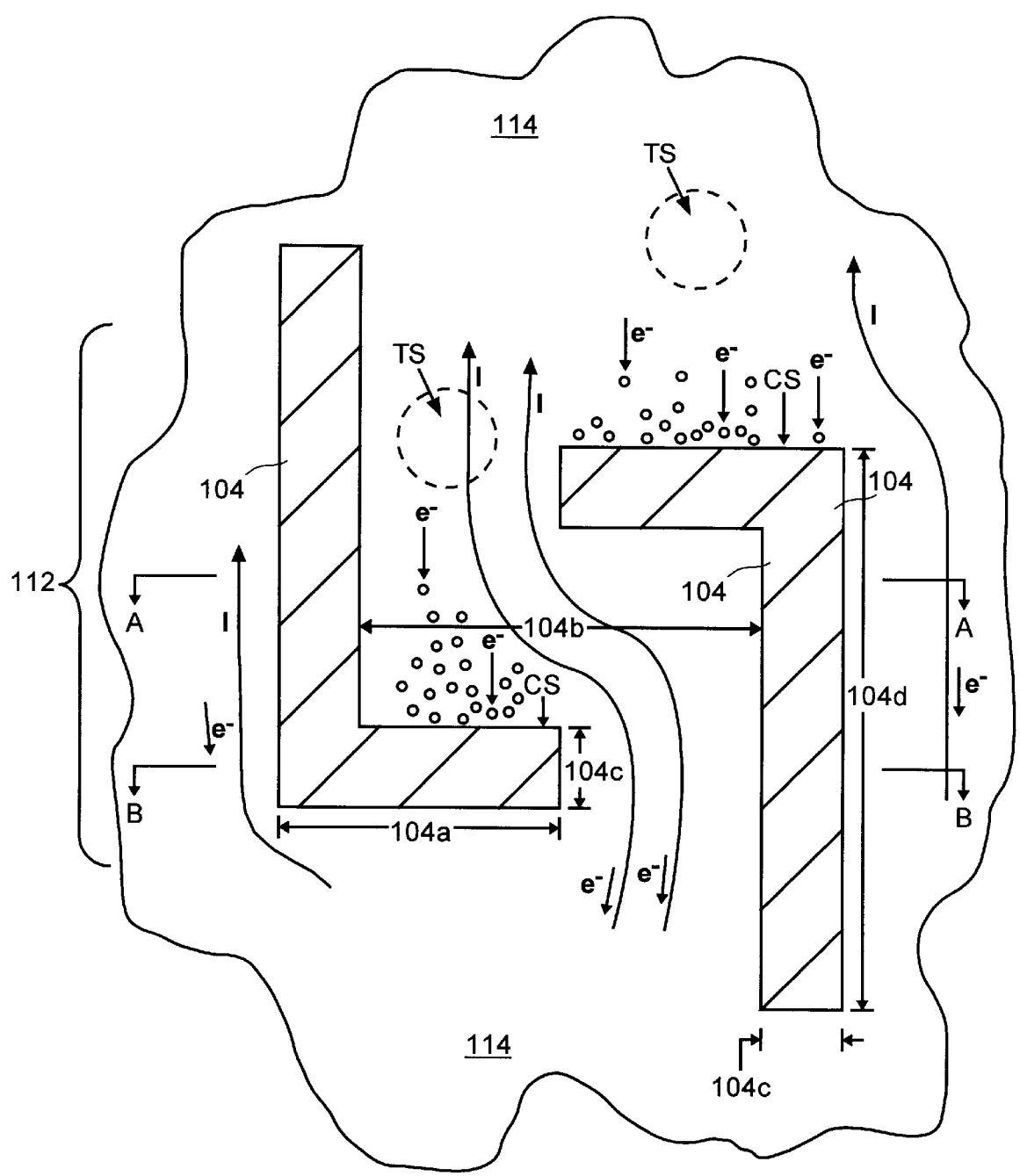
FIG. 3 illustrates exemplary oxide filled patterns, associated metal atom flows, and tensile and compressive stresses in response to electron/current flows, in accordance with one embodiment of the present invention.

The regular formation of the oxide features 112 along a metallization line therefore assists in creating regular variations in electric current density along the line. The variation of current density will occur if the oxide features 112 are arranged such that cross-sectionals along the metallization line vary along the line as shown in FIG. 3, for example, at cross-sections A—A and B—B. Variations in current density will cause flux divergences in the metal flow since the metal flow from electromigration is proportional to current density. Therefore, the strategic placement of the oxide patterns 112 within the distance BL will facilitate the inducement of the largest stress gradients for a given current density.

FIG. 3 further pictorially illustrates a case in which current "I" is flowing in one direction and electrons are flowing in the opposite direction. The electron flow, as discussed above, is primarily responsible for causing metal atoms to drift. Because metal atoms are shifted from a prior stable location, the aforementioned stress gradients will form between regions of tensile stress (TS) and regions of compressive stress (CS). The pictorial illustration shows how a build-up of atoms will result against the oxide patterns 112 and the TS regions will lie just up stream from the build-up of metal atoms.

In general, the oxide patterns 112 can take on any number of geometric shapes so long as they are arranged in such a way to induce the stress gradients between TS and CS at intervals dictated by the Blech length (BL). Accordingly, FIG. 3 illustrates a case where the oxide patterns 112 are arranged as opposing L patterns 104.

In this embodiment, the opposing L patterns 104 are formed by first designing an etch mask that will enable the etching of feature patterns into the metallization feature 102 and then subsequently filling the etched patterns with a dielectric material. Generally, the dielectric material that fills that features 104 may be the same dielectric material used for the inter-metal oxide (IMO) 106 shown in FIG. 2A. Alternatively, the dielectric material used to fill the features 104 may be different than that of IMO 106, which would require a separate deposition operation to fill the etched features 104. For example, the dielectric material used to fill the features 104 may be selected from any number of deposited silicon dioxide ($SiO_2$) materials, or even spin-on glass (SOG).

In typical embodiments, the metallization line 114 that may be routed throughout an integrated circuit to complete interconnections on various levels, is preferably designed to different widths, depending upon the micron technology being implemented in a design and the functional use of the particular line. However, once the width of the line and the current density for that line is set, the BL can be ascertained to enable correct placement of the stress gradient inducing oxide features 112.

Still referring to FIG. 3, the pair of opposing L patterns 104 are provided with exemplary dimensions 104a, 104b, 104c, and 104d, in cases where the width of the metallization line 114 is about 35 microns. For example, dimension 104a may range between about 2 microns and about 50 microns, and more preferably, range between about 3 microns and about 10 microns, and most preferably, is about 5 microns. Dimension 104b preferably ranges between about 2 microns and about 50 microns, and more preferably, ranges between about 6 microns and about 20 microns, and is most preferably about 10 microns. Dimension 104c preferably ranges between about 0.2 micron and about 5 microns, and more preferably ranges between about 0.4 micron and about 1 micron, and most preferably is about 0.5 micron. Finally, dimension 104d ranges between about 5 microns and about 50 microns, and more preferably ranges between about 10 microns and 20 microns, and most preferably, is about 15 microns.

These optimal dimensions may also vary, however, depending upon the width of the metallization line 114. This is because if the oxide patterns 104 take up too much area, the composite metallization region of the metallization line 114 may become a region of excessive resistance. In a preferred embodiment, so long as the resistance along the line is not increased by more than 15%, the resistance of the composite metallization may not become a problem. However, the acceptable level of resistance along a composite metallization region will generally depend upon the design specifications of a given integrated circuit device being fabricated.

Figure 4:
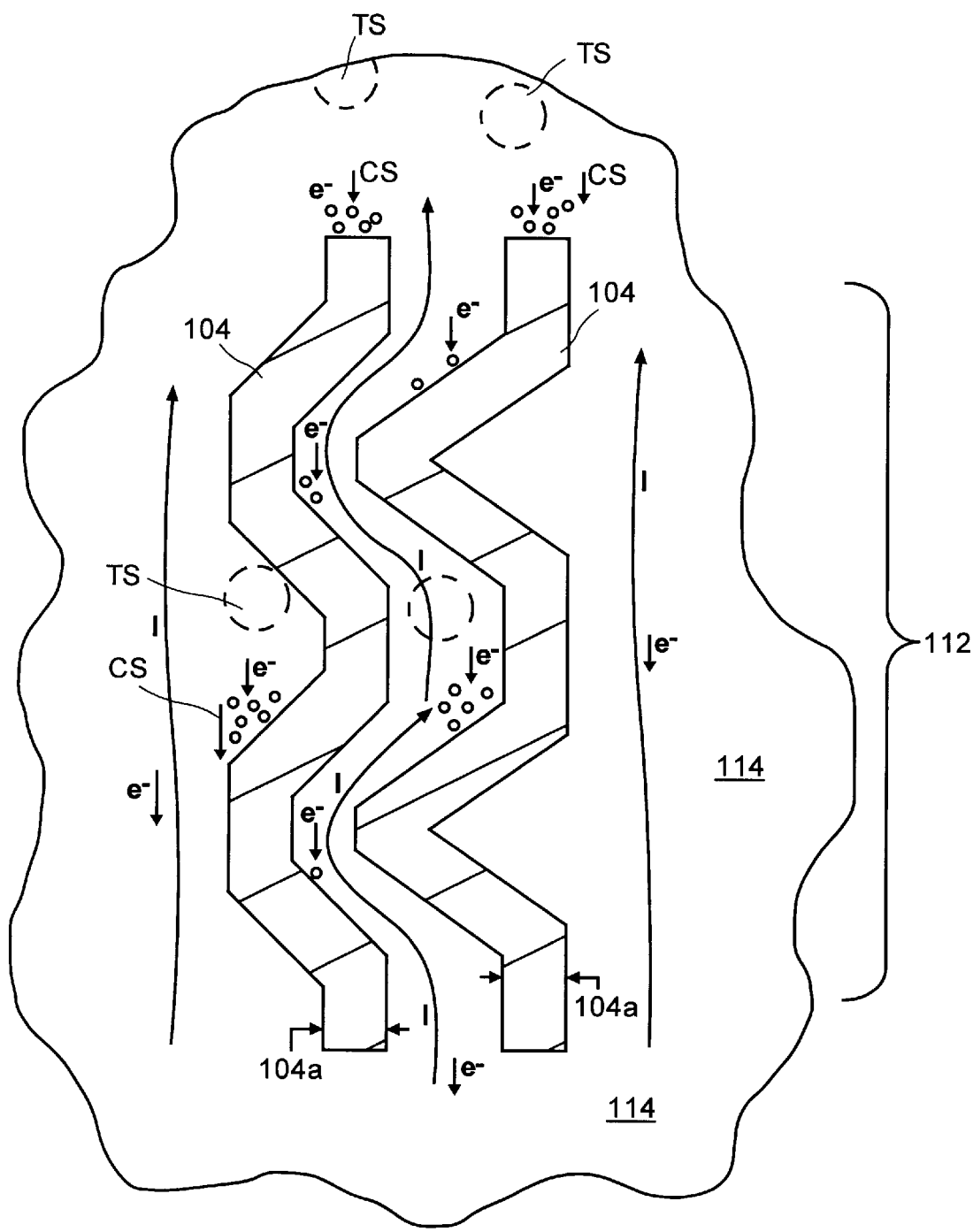
FIG. 4 illustrates another embodiment of oxide patterns (e.g., complementary zig-zag patterns) which may be patterned at intervals along a metallization line, in accordance with one embodiment of the present invention.

FIG. 4 illustrates another embodiment of oxide patterns 104 (e.g., complementary zig-zag patterns) which may be patterned at intervals along a metallization line 114, in accordance with one embodiment of the present invention. As pictorially illustrated, when the oxide features 112 of FIG. 4 are patterned in a metallization line that is carrying a particular current density, regions of tensile stress (TS) and compressive stress (CS) will form to generate a stress gradient. As in the above described embodiments, the oxide patterns 104 are designed in intervals that have no more than the a BL of separation, and the aforementioned electromigration voiding can be substantially prevented due to the periodic back-flow forces $F_A$ along the line. In this embodiment, the oxide patterns 104 preferably have a width 104a ranging between about 0.2 micron and about 5 microns, and more preferably between about 0.4 micron and about 1 micron, and most preferably about 0.5 micron.

Figure 5:
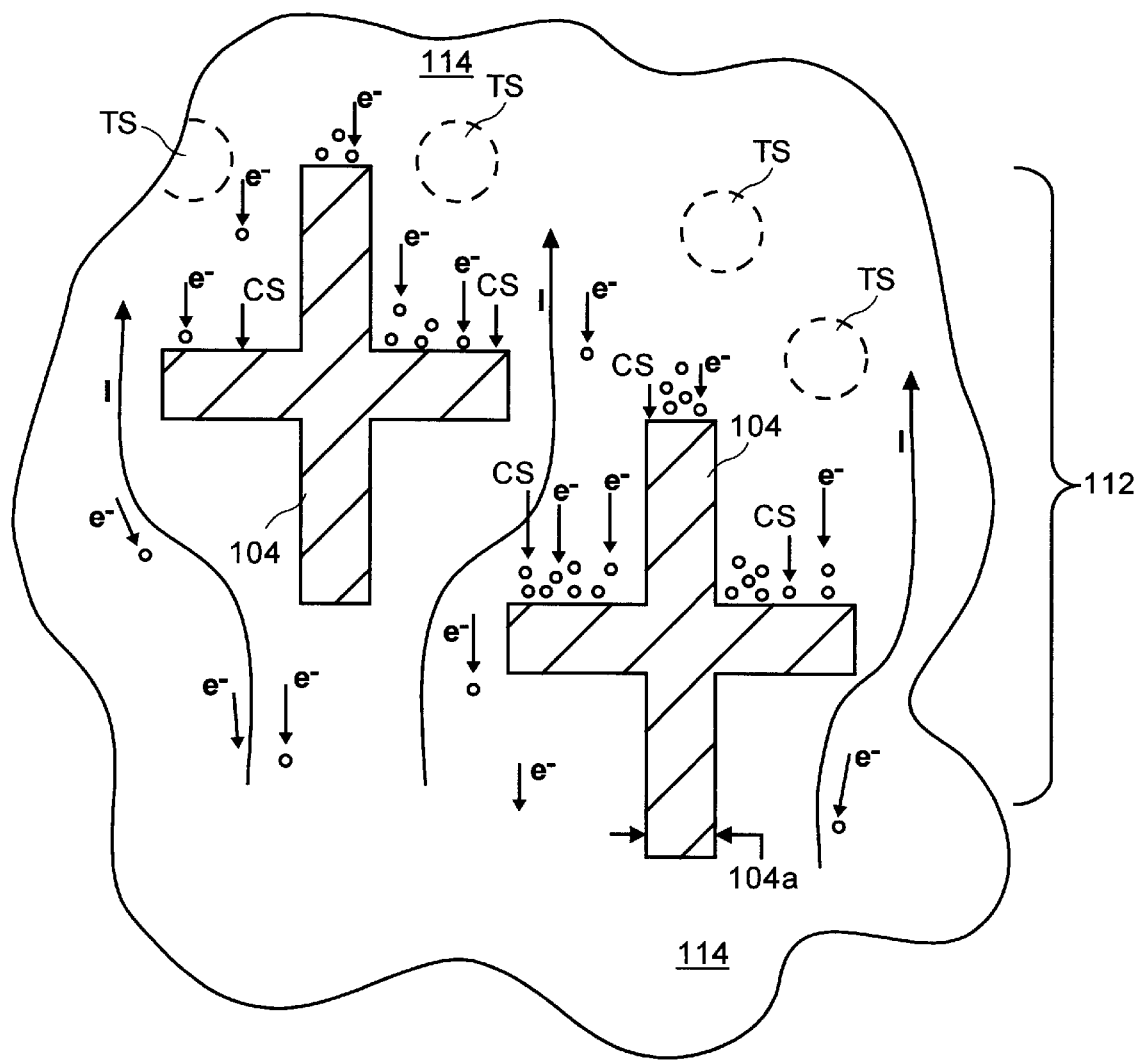
FIG. 5 illustrates yet another embodiment of the present invention in which complimentary cross "+" patterns are formed to make oxide features at interval regions of a metallization line, in accordance with this embodiment of the present invention.

FIG. 5 illustrates yet another embodiment of the present invention in which complimentary cross "+" patterns 104 are formed to make oxide features 112 in interval regions of the metallization line 114, in accordance with this embodiment of the present invention. As shown, within the oxide feature 112 region, which is preferably repeated at intervals dictated by the BL, stress gradients defined by the corresponding tensile stress (TS) and compressive stress (CS) assist in preventing the unimpeded drift of metal atoms along a metallization line 114. Accordingly, the problematic electromigration voids are substantially prevented, thus enabling the design of more reliable interconnect metallization lines throughout an integrated circuit chip.

Figure 6:
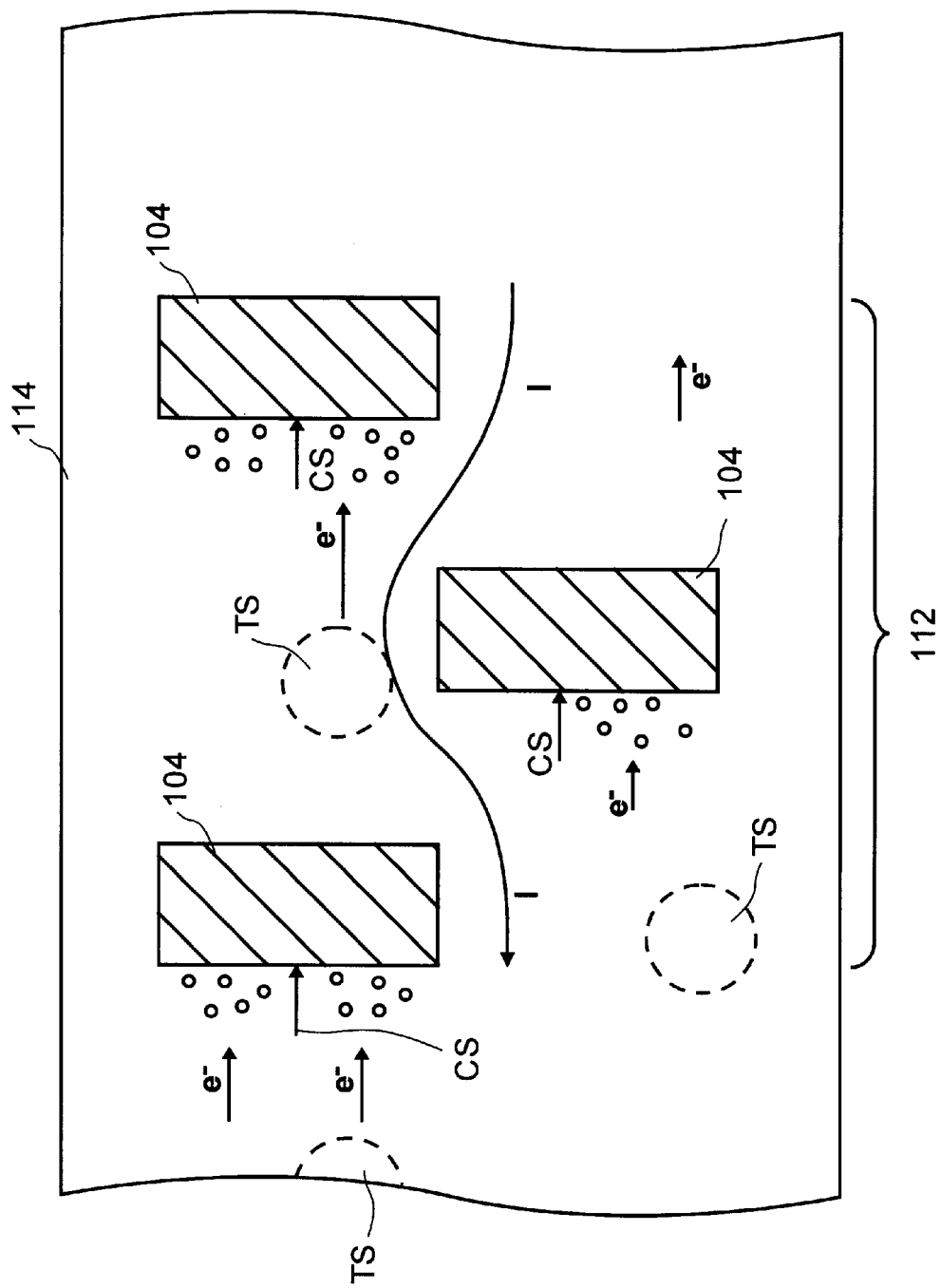
FIGS. 6 and 7 illustrate other embodiments in which oxide features (ie., geometric stubs) are formed in a metallization line, in accordance with one embodiment of the present invention.
Figure 7:
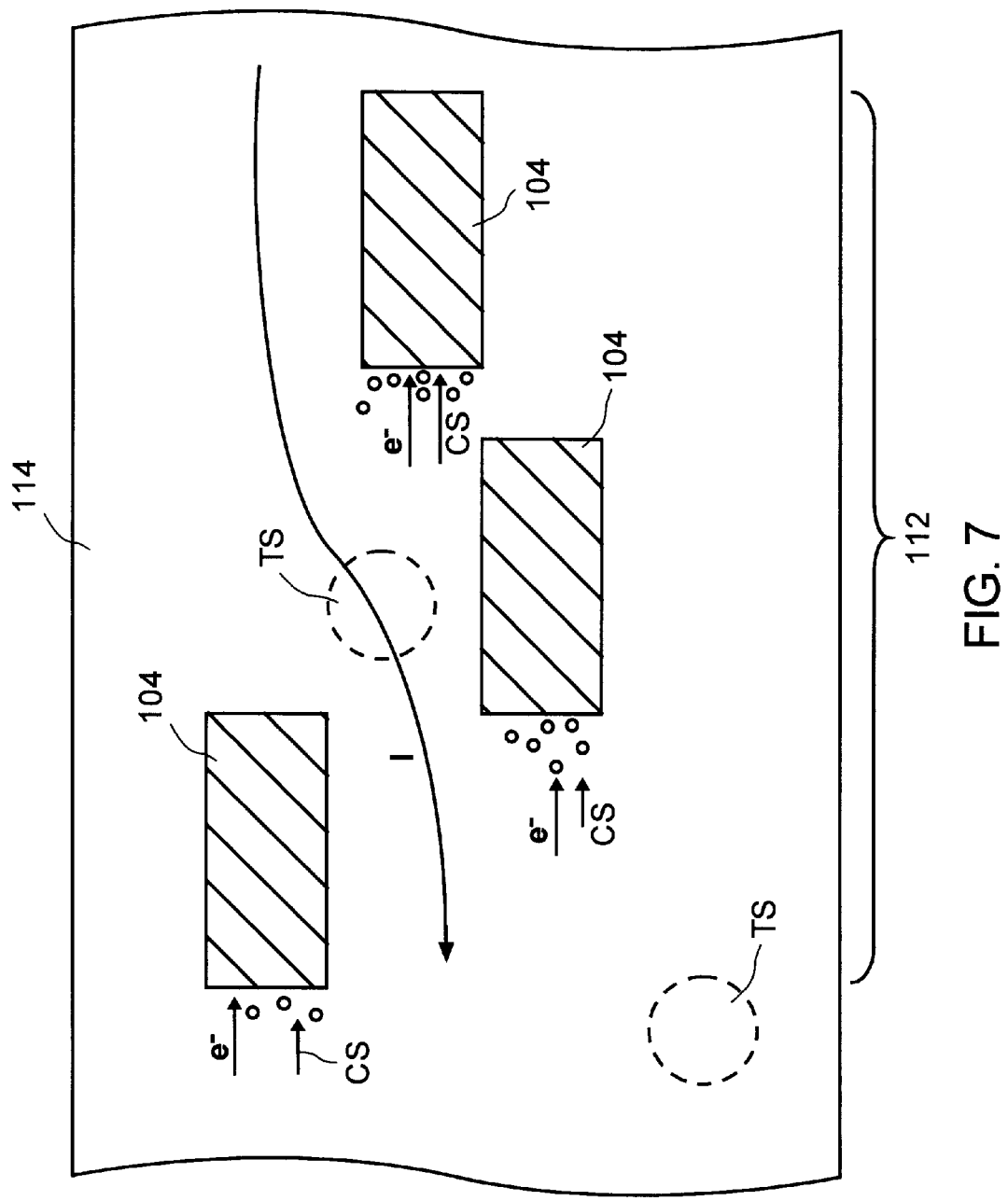

FIG. 6 illustrates yet another embodiment in which oxide features 112 (i.e., geometric stubs) are formed in a metallization line 114 in accordance with one embodiment of the present invention. In this oxide feature orientation, the oxide patterns 104 are also configured to produce regions in which there is tensile stress (TS) and compressive stress (CS). These regions of tensile stress and corresponding compressive stress therefore form the aforementioned stress gradients at each of the oxide feature 112 locations along the metallization line 114. As pictorially illustrated, the electron flow will be opposite that of the current flow which causes metal atoms to flow and migrate up against the oxide features 104, thus causing compressive stress. FIG. 7 illustrates still another exemplary orientation of the oxide features 112 along a metallization line 114. This diagram also illustrates the corresponding regions of tensile stress (TS) and compressive stress (CS).

Figure 8A:
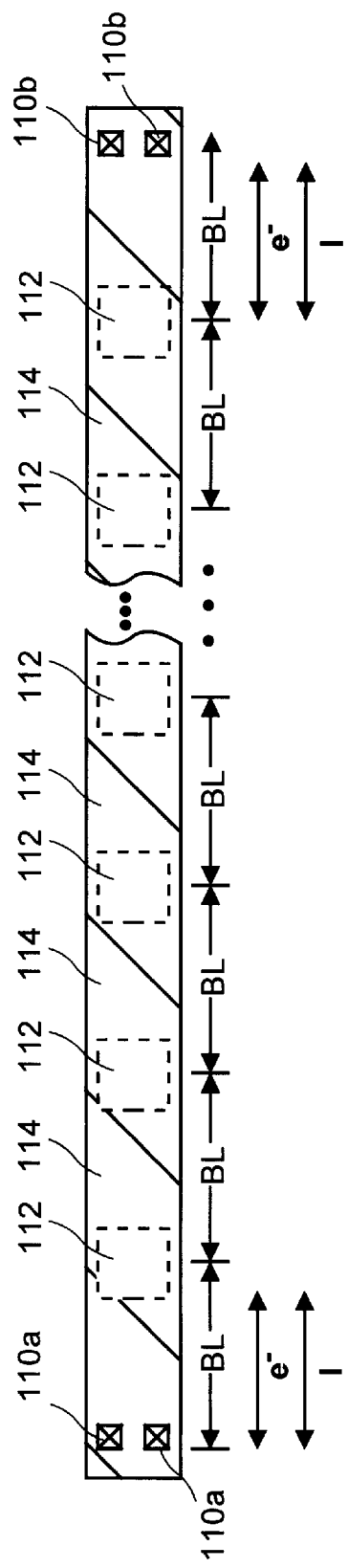
FIGS. 8A through 8C illustrate embodiments in which the oxide features are places in only certain locations depending upon anticipated current densities of particular metallization lines.
Figure 8B:
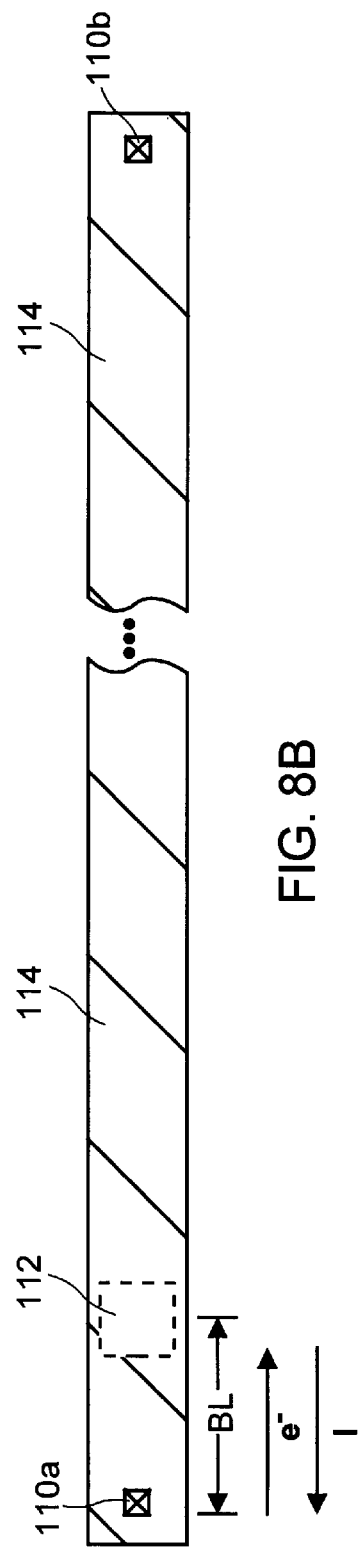
Figure 8C:
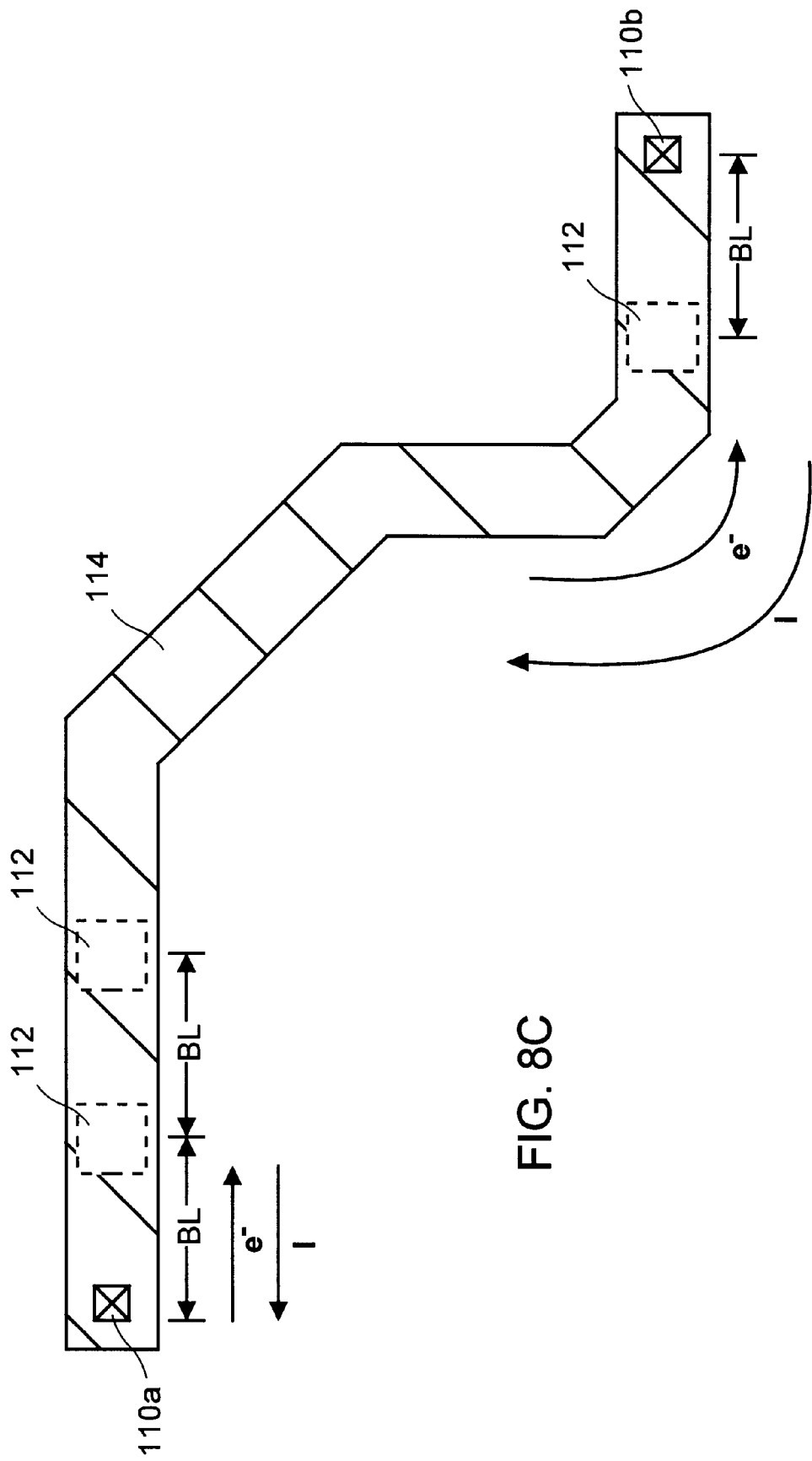

FIGS. 8A through 8C illustrate further exemplary embodiments of the present invention, in which oxide features 112 are patterned along the metallization line 114. Specifically, FIG. 8A illustrates a situation in which the metallization line 114 is coupled to conductive vias 110a at one end of the metallization line, and 110b at the other end of the metallization line. In order to most effectively prevent electromigration voiding, the oxide features 112 are separated by Blech length (BL) intervals in order to induce the periodic stress gradients that will prevent excessive electromigration along the metallization line 114, when the line is longer than the Blech length.

FIG. 8B illustrates an alternative embodiment in which a single oxide feature 112 region is patterned in the metallization line 114, only at the beginning of the electron flow of the given line. As mentioned before, electromigration voiding is most prevalent at the beginning of metallization lines, and therefore if the current densities chosen for a particular line may not cause electromigration voiding after the first Blech length along the metallization line 114 has been encountered, there may not be a need to pattern more than a single oxide feature 112 region for that given line.

FIG. 8C shows yet another example in which a metallization line has a particular curve geometry, and including only several oxide feature 112 regions at each end of the line. For example, if the current is flowing away from conductive via 110b and toward conductive via 110a, the electron flow will be from the direction starting at conductive via 110a and traversing toward conductive via 110b. In such a situation, the oxide features 112 may only be required near the beginning end starting at conductive via 110a, which would reduce the need to pattern additional oxide features 112 all along the metallization line 114. Alternatively, if the electron flow proceeded from conductive via 110b toward conductive via 110a, there may also be a need for oxide feature 112 regions at about the Blech length from the conductive via 110b.

In either case, the patterning of the oxide features 112 can be accomplished depending upon known variables, such as the current densities, line widths, line thicknesses and quality of metals used for a particular metallization line. In certain cases, the potential electromigration voiding will be quite minimal and therefore will require fewer oxide feature 112 regions along the metallization line 114. In other cases, the current densities and metallization line 114 width and thickness may be such that oxide feature 112 regions should be placed at each interval of a Blech length as shown in FIG. 8A. Of course, these determinations can only be precisely made when it is determined what the location and function of the metallization line will be in an integrated circuit design, and the particular current carrying requirements assigned to that metallization line.

Figure 9:
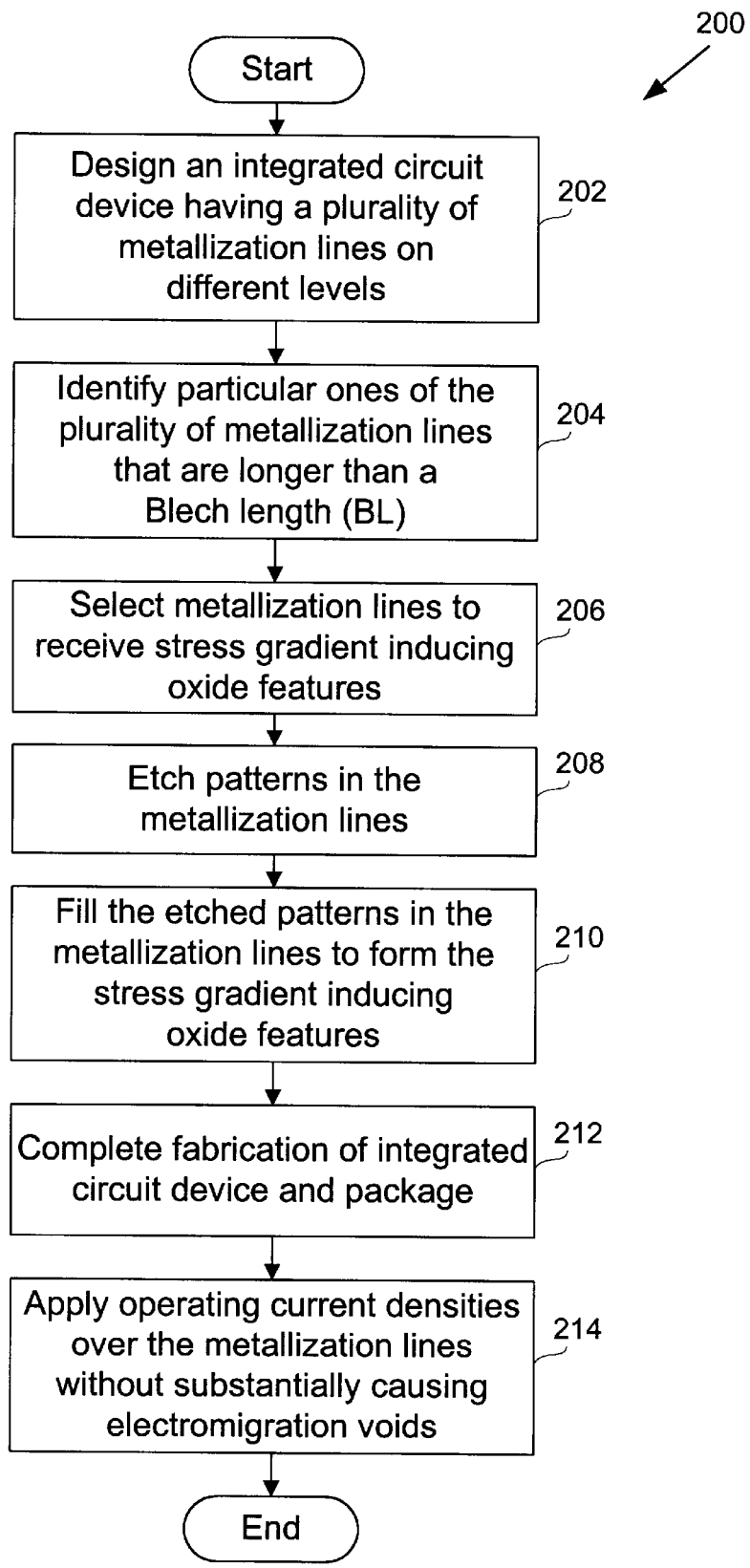
FIG. 9 illustrates a flowchart in accordance with one embodiment of the present invention, which outlines the strategic implementation of stress gradient inducing oxide features to substantially retard electromigration voiding.

FIG. 9 illustrates a flowchart 200 in accordance with one embodiment of the present invention, which outlines the strategic implementation of stress gradient inducing oxide features to substantially retard electromigration voiding. The method of flowchart 200 begins at an operation 202 where an integrated circuit device having a plurality of metallization lines on different levels is designed. Once the design has been completed in operation 202, the method will proceed to an operation 204. In operation 204, particular ones of the plurality of metallization lines that are longer than a Blech length (BL) are identified. Specifically, those metallization lines that are known to carry substantial current densities, such as wide power buses (e.g., Vdd/Vss), among others lines, are identified.

Once the particular ones of the plurality metallization lines are identified, the method proceeds to an operation 206 where metallization lines that are configured to receive the stress gradient inducing oxide features are selected. Once the particular metallization lines have been selected, patterns such as the exemplary patterns illustrated in FIGS. 2B, 3, 4, 5, 6, and 7 are etched into the metallization lines at intervals defined by the Blech length. Now that the particular patterns have been etched, the method will proceed to an operation 210 where the etched patterns are filled with an oxide material to form the stress gradient inducing oxide features.

After the etched patterns have been filled appropriately, the method will proceed to an operation 212 where the fabrication of the integrated circuit device is completed and the integrated circuit device is packaged in a suitable package arrangement. The method will then proceed to an operation 214 where operating currents having associated current densities are applied over the metallization lines without substantially causing electromigration voids. Of course, once the packaged integrated circuit device has been completed, higher test current densities may be applied to the metallization lines in order to test the effectiveness of the stress gradient inducing oxide features in preventing the electromigration voids throughout the integrated circuit device.

In general, the oxide features that are patterned throughout the metallization lines will therefore define composite metallization lines that will be more resistant to void formation due to electromigration. Such composite metallization lines may be incorporated into any level of an interconnect metallization line scheme. Additionally, the composite metallization may incorporate any type of oxide pattern which may suitably induce the stress gradients between tensile stress and compressive stress as described above. Accordingly, the geometric illustrations of the oxide features are only exemplary, and any number of geometric patterns may be used in order to induce the stress gradients at the determined Blech lengths along a metallization line.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. In a semiconductor integrated circuit device, having a plurality of metallization levels of patterned metallization lines, comprising:

a metallization line having a first end and a second end; and oxide feature regions defined in the metallization line, the oxide feature regions being defined along the metallization line between the first end and the second end, and each of the oxide feature regions are configured to define a region of increased metallization atom concentration and a corresponding increased back-flow force.

2. The semiconductor integrated circuit device as recited in claim 1, wherein each one of the oxide feature regions are configured to be separated from a previous oxide feature region by about a Blech length.

3. The semiconductor integrated circuit device as recited in claim 2, wherein the Blech length is a variable determined by a width and thickness of the metallization line and a current density to be applied along the metallization line.

4. The semiconductor integrated circuit device as recited in claim 2, wherein a lower concentration of metal atoms is defined at a beginning of the Blech length between each of the oxide feature regions due to metal atom electromigration, and a produced stress gradient between tensile stress at the beginning of the Blech length and a compressive stress at walls of the oxide feature regions.

5. The semiconductor integrated circuit device as recited in claim 2, wherein the metallization line has a width ranging between about 5 microns 100 microns and a thickness ranging between about 4,000 angstroms and about 10,000 angstroms.

6. The semiconductor integrated circuit device as recited in claim 5, wherein a current density of about $6 \times 10^5$ amps/cm$^2$, for the metallization line having a width of about 35 microns and a thickness of about 5,000 angstroms, sets the Blech length at about 50 microns.

7. The semiconductor integrated circuit device as recited in claim 1, wherein each one of the oxide feature regions include one or more geometric oxide patterns.

8. The semiconductor integrated circuit device as recited in claim 7, wherein the one or more geometric oxide patterns include patterns selected from a group consisting of L patterns, opposing L patterns, zig-zag patterns, cross-patterns, and stub patterns.

9. The semiconductor integrated circuit device as recited in claim 7, wherein the one or more geometric oxide patterns have a width ranging between about 0.2 micron and about 5 microns.

10. A semiconductor integrated circuit device, having a plurality of metallization levels of patterned metallization lines, comprising:

a metallization line having a first end and a second end; and oxide feature regions defined in the metallization line, the oxide feature regions being defined along the metallization line between the first end and the second end, each one of the oxide feature regions are configured to be separated from a previous oxide feature region by about a Blech length, and each of the oxide feature regions are configured to define a region of increased metallization atom concentration and a corresponding increased back-flow force.

11. A semiconductor integrated circuit device as recited in claim 10, wherein the Blech length is a variable determined by a width and thickness of the metallization line and a current density to be applied along the metallization line.

12. A semiconductor integrated circuit device as recited in claim 11, wherein each one of the oxide feature regions include one or more geometric oxide patterns.

13. A semiconductor integrated circuit device as recited in claim 12, wherein the one or more geometric oxide patterns include patterns selected from a group consisting of L patterns, opposing L patterns, zig-zag patterns, cross-patterns, and stub patterns.

14. The semiconductor integrated circuit device as recited in claim 11, wherein a lower concentration of metal atoms is defined at a beginning of the Blech length between each of the oxide feature regions due to metal atom electromigration, and a produced stress gradient between tensile stress at the beginning of the Blech length and a compressive stress at walls of the oxide feature regions.

15. The semiconductor integrated circuit device as recited in claim 10, wherein the metallization line has a width ranging between about 5 microns to 100 microns and a thickness ranging between about 4,000 angstroms and about 10,000 angstroms.

* * * * *